United States Patent [19]
Botham

[11] Patent Number: 5,905,967
[45] Date of Patent: May 18, 1999

[54] TIMING GENERATOR WITH MULTIPLE COHERENT SYNCHRONIZED CLOCKS

[75] Inventor: Michael P. Botham, Chelmsford, Mass.

[73] Assignee: Teradyne, Inc., Boston, Mass.

[21] Appl. No.: 08/971,625

[22] Filed: Oct. 22, 1997

Related U.S. Application Data

[63] Continuation of application No. 08/405,326, Mar. 16, 1995, abandoned.

[51] Int. Cl.⁶ ..................................................... G01R 31/28
[52] U.S. Cl. .......................... 702/118; 702/124; 702/125; 327/273; 371/27.7
[58] Field of Search ............................ 364/579; 702/118, 702/124, 125, 126; 371/21.01–21.06, 27.7; 327/273

[56] References Cited

U.S. PATENT DOCUMENTS

| | | | |
|---|---|---|---|
| 4,063,308 | 12/1977 | Collins et al. | 364/200 |
| 4,101,761 | 7/1978 | Merryman | 235/92 |
| 4,231,104 | 10/1980 | St. Clair | 364/900 |
| 4,564,953 | 1/1986 | Werking | 377/52 |
| 4,779,221 | 10/1988 | Magliocco et al. | 364/900 |
| 4,789,835 | 12/1988 | Herlein | 328/72 |
| 5,274,796 | 12/1993 | Conner | 395/550 |
| 5,321,700 | 6/1994 | Brown et al. | 371/27 |

FOREIGN PATENT DOCUMENTS

| | | | |
|---|---|---|---|
| 474274 | 3/1992 | European Pat. Off. | G01R 31/28 |
| 2252418 | 8/1992 | United Kingdom | G01R 31/28 |

OTHER PUBLICATIONS

ATE pin electronics. Versatile ICs reach beyond ATE systems, Conner. Technology Update. Apr. 1991.

Primary Examiner—Kamini S. Shah
Attorney, Agent, or Firm—Edmund J. Walsh

[57] ABSTRACT

Automatic test equipment with programmable timing generators to generate digital signals and analog signals. The digital timing generator can be programmed to generate timing signals with a resolution finer than that of the master clock of the timing generator. Extremely fine resolution is achieved by specifying the numerator and denominator of a fractional portion of a period. A similar arrangement is used to allow fine frequency resolution for the analog timing generator. The fine resolution achievable with the timing generators allows the digital timing generator to be synchronized to the analog timing generator.

20 Claims, 4 Drawing Sheets

TIMING GENERATOR WITH MULTIPLE COHERENT SYNCHRONIZED CLOCKS

This application is a continuation of application Ser. No. 08/405,326, filed on Mar. 16, 1995, now abandoned.

This invention relates generally to automatic test equipment and more specifically to timing generators used in automatic test equipment.

Automatic test equipment is widely used by manufacturers of semiconductor components. The test equipment (more generally a "tester") executes a test pattern which defines inputs to the device under test (DUT) and the expected outputs. By executing the test pattern, the tester determines whether the component is operating properly.

Proper operation of a semiconductor component requires that it produce outputs of a specified value. In addition, those values must occur at a specified time in relation to the application of the input signals. As a result, testers generally include timing generators.

The timing generator performs several functions. First, it allows timing information to be programmed by a user of the tester. For example, digital systems operate at a specific frequency with a characteristic period. Some timing generators allow the period to be programmed so that the tester may test parts at various frequencies.

In addition, the timing generator must ensure that signals are synchronized when they are applied to the leads of the DUT. For example, a typical semiconductor component might have tens or even hundreds of leads to which signals need to be applied or measured. Each lead is generally connected to a "channel" of the tester. Each channel contains circuitry which generates or measures the signal applied to one lead. Different distances between the timing generator and each channel lead to different delays. As a result, signals issued by the timing generator which are intended to reach each channel at the same often reach the channels at different times (i.e. they are "skewed"). Skew within the tester can lead to an improper diagnosis that the DUT is faulty.

One type of timing generator design which has been used to combat these problems is known as a digital timing generator. Examples of such timing generators may be found in patents by St.Clair and Conner. A digital timing generator contains two pieces: a global timing generator and a local timing generator. There is one global timing generator for the tester and one local timing generator for each channel.

The global timing generator issues a course period pulse. There is one course period pulse for each period. The global timing generator operates from a fixed frequency clock so that the period pulse is synchronized with this fixed frequency clock. The length of the period is programmed by storing a binary value which indicates the number of pulses of the fixed frequency clock which are needed to make up one period of the programmed length.

To allow the tester to operate at frequencies which are not integer multiples of the fixed frequency (master clock) at which the timing generator operates, the high order bits of the stored binary value represent an integer number of pulses of the fixed frequency clock which should occur in one period. The low order bits of the binary value represent a binary fraction of the length of one fixed frequency period which needs to be added to the integer number of pulses to make the programmed period equal the specified time. A binary fraction represents an integer number which has been divided by a power of 2.

In operation, the global timing generator counts the integer number of pulses and then issues a course period pulse. The course period pulse is sent to all the local timing generators. The course period pulse does not, however, account for the binary fractional portion of the stored value. To account for this fractional delay, a digital residue signal is also sent to each local timing generator which indicates how long after the course period pulse the actual period pulse should occur. The local timing generator uses a binary interpolator to delay the period pulse by the amount of time specified by the digital residue signal.

The digital residue signal is generated by the global timing generator by accumulating the fractional part of the stored programmed period length. The first course period pulse occurs that fractional amount before the desired time. The second course period pulse occurs twice the fractional amount before the desired time. The third course period pulse occurs three times that fractional amount; and so on. At some point, the accumulated value exceeds one period of the fixed frequency clock. When that happens, the global timing generator waits one master clock period before issuing the next course period pulse and reduces the accumulated residue value accordingly.

This scheme has the advantage of allowing timing information, regardless of the programmed frequency at which the tester operates, to be sent to all of the channels at a single frequency. The residue, as it is digital, is not affected by differential delay. Any differential delay in the course period pulse can be eliminated by synchronizing it to the master clock. Since the master clock is a single, fixed frequency, it is possible to design the tester to distribute the master clock to all the channels without skew.

While this type of timing generator is well suited for testing purely digital semiconductor components, we have found that it has some shortcomings when used to test mixed signal components. Mixed signal components operate on digital signals as well as analog signals. For example, an analog-to-digital converter has an analog input and a digital output. To test an analog component, the frequency of the generated test signals must be controlled far more precisely than is needed to test a digital component.

For example, to generate an analog waveform in a mixed signal tester, the timing signals are used to access memory locations. The locations contain the digital values which define an analog waveform. Each timing pulse causes the next value to be read out of the memory and converted to an analog value. The converse operation occurs to test an analog waveform. Each timing pulse causes another sample of the waveform to be taken and stored in memory.

Testing analog components in this fashion requires that the frequency of the timing pulses be specified with very high resolution. We believe that testing an analog component requires that the frequency of tester operation be programmable to within 1 Hz. With a binary digital timing generator, a resolution of 1 Hz would require many bits in the stored period value. For example, to adequately represent both 60 MHz and 60.000001 MHz would require an impractical number of bits.

To solve this problem, mixed signal testers have used separate timing generators for the analog and digital portions of the tester. For example, a very accurate programmable timing source can be purchased, such as a PTS box. Such timing generators have been used for the analog portion of the tester while a binary timing generator has been used for the digital portion.

Using two timing sources creates a different problem. To test a mixed signal part, it is often necessary that the analog and digital portions of the tester be synchronized and coherent. It is possible to synchronize the two timing sources at the start of a test pattern. However, unless the sources are operating at the same frequency (i.e. are coherent), the sources will "drift apart" as the tester operates.

There is, thus, a need for a timing generator which can obtain all the benefits of a binary digital timing generator while providing greater control over frequency and allowing synchronization with other sources.

SUMMARY OF THE INVENTION

With the foregoing background in mind, it is an object of the invention to provide a digital timing generator which produces pulses at a programmable frequency which can be specified with high resolution.

It is also an object to provide a timing generator which can be synchronized to other timing generators.

It is yet another object to provide a mixed signal tester with a synchronized timing for generation of analog and digital timing signals.

The foregoing and other objects are achieved with a timing generator having one or more global portions and one or more local portions. To program the timing generator to produce pulses with a required period, the length of the programmed period is expressed as an integer number of periods of a master clock plus a fractional number of periods. The fractional portion is expressed as the ratio of two binary integers. The global portion contains digital storage for values representing the numerator and denominator of the fraction. A residue signal, representing the accumulated numurator of the fraction, is provided to the the local timing generator.

In one embodiment, the residue is converted to a binary fraction prior to being passed to the local timing generator.

In another embodiment, multiple global timing generators are used. Synchronization circuitry allows the timing generators to be synchronized, even though they are programmed to generate timing signals at different frequencies.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
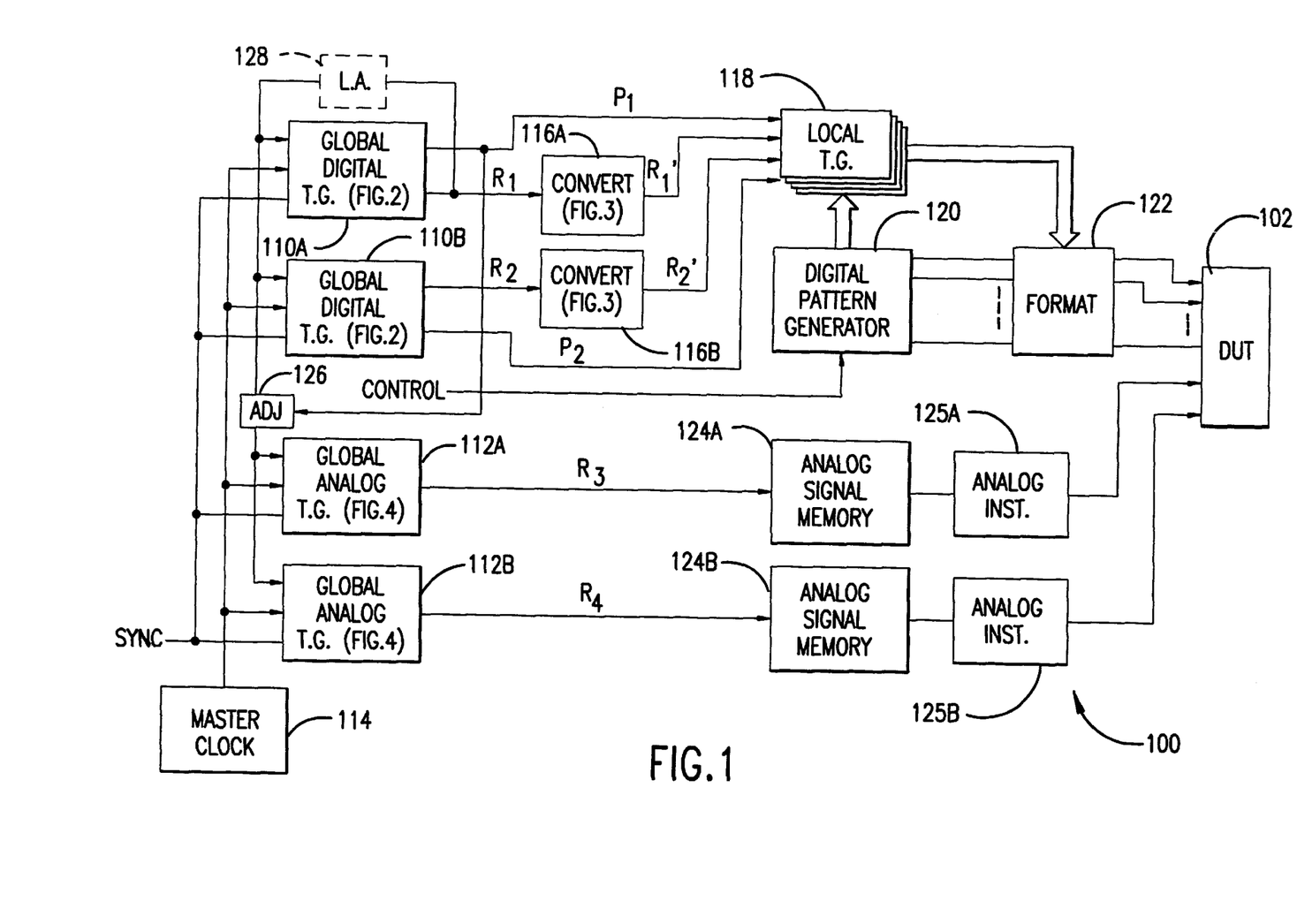
FIG. 1 is a block diagram of a mixed signal tester incorporating the timing generator of the invention.

FIG. 1 shows a mixed signal tester 100 incorporating a timing generator of the invention. Tester 100 has a plurality of signal lines connected to device under test (DUT) 102. DUT 102 could be a semiconductor component, such as a chip used to make an analog to digital converter or a digital signal processing chip.

Tester 100 generates and receives both analog and digital signals to be used in testing DUT 102. Tester 100 contains a digital pattern generator 120 which generates a digital test pattern. The test pattern specifies, for each cycle of operation of tester 100, the digital signals that should be provided to or are expected to be received from DUT 102.

The times at which each digital signal is applied or read from the device are controlled by a timing generator. The timing generator produces numerous timing signals, or edges. Drive and sense operations performed by tester 100 are synchronized to these edges. Tester 100 may be programmed to specify which operation is synchronized to which edge signal. In addition, the time at which an edge signal can occur relative to the start of each period can also be programmed.

One or more global digital timing generators 110A and 110B are included in tester 100. Taking global timing generator 110A as illustrative, global timing generator 110A produces two timing signals. Signal $P_1$ is the course period signal as in a conventional tester. Signal $R_1$ is a fractional residue signal. Fractional residue signal $R_1$ is applied to convert circuit 116A, where it is converted to a binary residue signal $R_1'$, as in conventional testers.

Course period signal $P_1$ and binary residue signal $R_1'$ are provided to one or more local timing generators 118, as in conventional testers. Each local timing generator produces an edge signal an appropriate amount of delay after the course period signal $P_1$.

The edge signals are provided to format circuit 122. Digital drive or expected receive data from digital pattern generator 120 is also provided to format circuit 122. As in a conventional tester, format circuit 122 drives the appropriate values to DUT 102 and compares received values to the expected value at times dictated by the timing edges.

Tester 100 is shown to contain two global digital timing generators, each connected to one or more local timing generators 118. All of the local timing generators 118 connected to one of the global timing generators 110A or 110B produce edge signals at the same rate that the global timing generator produces a course period signal. Though the exact timing of each individual edge may be changed, the data rates are all the same. Having two or more global timing generators allows sets of edges to be produced at different rates. Such a capability is useful to perform what is known as pseudo-asynchronous testing.

Tester 100 also has the capability to provide analog signals to DUT 102 or to receive analog signals from DUT 102 and compare them to stored reference signals.

Analog signals are produced by reading digital values out of analog signal memory 124A or 124B and applying them as inputs to analog instruments 125A and 125B. Based on the outputs of analog signal memories 124A and 124B, analog instruments generate the required signals for DUT 102.

Analog signal memories 124A and 124B store one period of an analog signal. Addresses are applied to the memory in a cyclical fashion, so that the values representing one period of the waveform are repeatedly read out of the memory. The rate at which the addresses are applied to the memory dictates the frequency of the signal.

In tester 100, the addresses for analog signal memories 124A and 124B are provided by global analog timing generators 112A and 112B, respectively. Global analog timing generators 112 are similar to global digital timing generators 110. However, global analog timing generators 112 do not have to produce a course period signal. They just need to produce signals which cycle through a range of values in the time of one period. Hence, they produce only the residue signals, which are then used to address memories 124.

Analog instruments 125A and 125B could be as simple as digital to analog converters. Typically, though, the signals out of analog signal memories 124A and 124B will be in the range of 5 MHz to 25 MHz. These signals might be further processed after conversion to analog signals, such as by frequency conversion or modulation.

Global digital timing generators 110A and 110B and global analog timing generators 112A and 112B all respond to master clock 114. Master clock 114 operates at a fixed frequency. For current technology, a frequency on the order of 100 MHz is suitable. Each of the global digital timing generators 110 and global analog timing generators are synchronized to global digital timing generator 110A. In the case of digital timing generator 110B, this means that the time specified by a delay of $R_2$ following course period pulse $P_2$ will be the same as a delay of $R_1$ following course period pulse $P_1$. In the case of global analog timing generators 112A and 112B, this means that the zero crossing of the analog signals produced in response to those timing signals will occur at the same time as a delay of $R_1$ following course period pulse $P_1$.

In order to achieve this synchronization, $R_1$ is provided to each of the other global timing generators. As shown in FIG. 1, it is provided directly to global digital timing generator 110B. The value of $R_1$ is passed through adjust circuit 126 before application to global analog timing generators 112A and 112B.

The SYNC signal could be generated in response to an instruction programmed into digital pattern generator 120. Alternatively, a tester is typically connected to a computer work station (not shown). The computer work station serves as a user interface and also generates commands for various portions of the tester. The SYNC signal might also be generated from the computer work station.

Global digital timing generators 110A and 110B and global analog timing generators 112A and 112B are programmable. Data values which specify the length of one period are provided to these elements. For global digital timing generators 110A and 110B, values denoted N, I and B are provided. These values relate the desired period, $T_{prog}$, to the period of master clock 114, $T_{MC}$. The relationship is as follows:

$$T_{prog}=N*T_{MC}+(I/B)*T_{MC} \qquad \text{Eq.1}$$

The values for N, I and B are all integer values. B is selected in advance and provided from the computer work station (not shown). Its value is arbitrary, but should be relatively large so that a wide range of fractional values (I/B) may be provided by only changing the value of I. To simplify the circuitry, the value of B might be constrained to be changed only from the computer work station at the start of a test pattern.

Once a value of B is selected, the values of N and I may be simply computed to provide the required programmed period. The values of N and I might be provided from the computer work station (not shown). Alternatively, the values might be provided by digital pattern generator 120. By allowing the values to be provided by digital pattern generator 120, the length of the programmed period could be changed during the execution of a test pattern.

Figure 2:
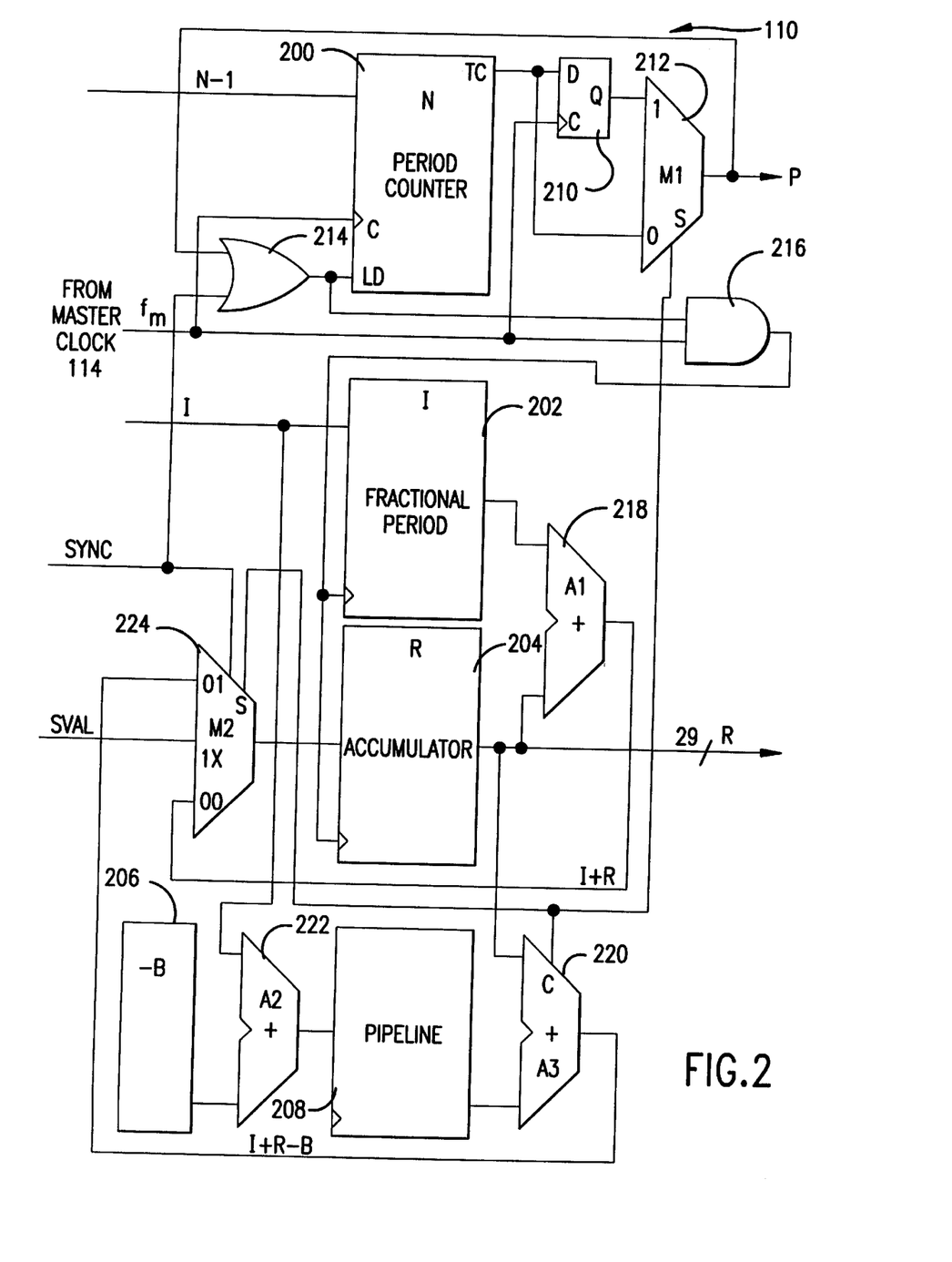
FIG. 2 is a schematic diagram of the global digital timing generator of FIG. 1.

Turning now to FIG. 2, further details of global digital timing generator 110 are shown. The value of N is loaded into counter 200. Counter 200 is a down counter which issues an output pulse at its output TC after it counts N pulses at its clock input. The clock input is connected to master clock 114. For convenience of implementation, it might be desirable for counter 200 to produce an output after it counts down past zero. In that case, the actual value loaded into counter 200 would be N-1, rather than N.

The TC output of register 200 is connected to delay 210. Delay 210 is a D-type flip-flop. It is clocked by master clock 114. Delay 210 delays the pulse output of counter 200 by one cycle of master clock 114.

The delayed output of delay 210 as well as the undelayed output of counter 200 are provided to the data inputs of multiplexer 212. Multiplexer 212 is a two input multiplexer. Its output provides the course period pulse signal P. The combination of delay 210 and multiplexer 212 allows the course period pulse to be the output of counter 200 or the counter output after it has been adjusted by one clock cycle. As will be described below, this adjustment is made to ensure that the course period pulse P is synchronized to the master clock pulse which occurs just before the end of the programmed period.

The period pulse signal P is fed back to one input of OR gate 214. The output of OR gate 214 is connected to the load input of counter 200. Thus, after a period signal has been issued, the value for N to be used in the next cycle is loaded into counter 200. The second input of OR gate 214 comes from the SYNC input. Thus, when it is desired that timing generators 110A, 110B 112A and 112B be synchronized, the value in counter 200 is also reloaded with a new value of N.

The value of I is loaded into register 202. Register 202 is clocked by the output of AND gate 216. AND gate 216 is the logical AND of master clock 114 and the load signal into counter 200. Thus, whenever a new N value is loaded into counter 200, a new I value is also loaded into register 202. The load into register 202 is, however, synchronized to master clock 114 by the operation of AND gate 216.

The value of B is loaded into register 206. For ease of implementation, the 2's complement version of B is actually loaded into register 206. This allows an adder to be used to perform subtraction operations. As the value of B is not changed during a test pattern, its 2's complement value may be computed by the computer work station (not shown).

Register 204 is also a conventional digital storage register. Its output is connected to the R output. The input of register 204 is connected to the output of multiplexer 224. Register 204 is also clocked by the output of AND gate 216. Thus, a new value is loaded, synchronized to master clock 114, whenever a period pulse is issued or when the SYNC value is asserted.

Multiplexer 224 is a conventional four input multiplexer with two select inputs. One select input is connected to the SYNC control input. When that input is asserted, multiplexer 224 passes the value on the SVAL input to register 204, regardless of the state of the second select input.

When register 204 is being loaded in response to a period pulse being issued rather than a SYNC signal, the value loaded is selected by multiplexer 224 in response to the carry out output of adder 220. The second select input of multiplexer 224 is connected to the carry out line of adder 220. When there is a carry out of adder 220, multiplexer 224 passes the output of adder 220 to register 204. When there is no carry out of adder 220, multiplexer 224 passes the output of adder 218 to register 204.

As long as there is no carry out of adder 220 and no SYNC command, register 204 acts as an accumulator. Each time a period pulse is issued, register 204 is loaded with the output of adder 218, which is the sum of the current value in register 204 and the value in register 202, i.e. the value, R, increases by an amount I.

Whether there is a carry out output of adder 220 also depends on the R value in register 204. One input of adder 220 is connected to the output of R register 204. The second input of adder 220 is derived from the output of adder 222 through pipeline register 208. Pipeline register 208 simply passes through the output of adder 222, but appropriately delays it to prevent an unstable operating condition.

The inputs of adder 222 are derived from register 206, which stores the negative value of B, and the I input. Thus, the output of adder 222 represents I−B. The output of adder 220 represents I+R−B.

The carry out line of adder 220 will be asserted when the value of I+R−B represents a positive value. Thus, when I+R-B is negative, R register 204 is loaded with the value of I+R. Conversely, when I+R−B is a positive value, R register 204 is loaded with the value of I+R−B. In other words, when increasing the value in R register 204 by another increment of I would cause the value of R to exceed B, the new value of R is offset by an amount B. simultaneously, because the carry out line of adder 220 is also connected to the select input of multiplexer 212, the occurrence of the period pulse P is delayed by one master clock pulse.

The significance of this operation can be understood by reference to Eq. 1. When timing generator 110 is reset, it is loaded with a value of N, representing the integer number of master clock pulses which must be counted and a value of I, representing a fractional portion. Upon reset, R register 204 should contain a value of zero. Once N master clock pulses have been counted, counter 200 issues its output, which is passed through multiplier 212 as the period pulse P. This pulse has occurred before the programmed period pulse by a fraction of a master clock period given by the fraction I/B. The period pulse P should be delayed by a fraction of a master clock period I/B and this value is stored as the residue, R. Because, in the preferred embodiment, B is only changed when timing generator 110 is reset, only the value of I need be stored (i.e. only the numerator of the fraction I/B is stored). The value of R is the residue output of global timing generator 110. The required additional delay specified by residue R is added by local timing generator 118.

In the next cycle, N master clock pulses are again counted and another period pulse is issued. During this cycle, the period pulse gets ahead of the programmed time by another fractional master clock cycle given by the fraction I/B. Thus, the residue value in register 204 is increased by another increment I.

In each successive cycle, the residue value in R register 204 is increased by another amount I. R register 204 is accumulating the fractional parts of the programmed periods. The fractional parts should be accumulated until they add up to an entire period of master clock 114. When I+R, representing the numerator of a fraction, is greater than B, representing the denominator of the fraction, the accumulated fractional amounts have exceeded one full period. The amount by which I+R has exceeded one period is given by I+R−B. This is the value computed by adder 220. Adder 220, because its carry out output changes when I+R exceeds B, also signals when the accumulated fractional parts exceed one period of master clock 114.

Once the accumulated fractional value exceeds one full period of master clock 114, the period pulse P is delayed by one master clock period at multiplexer 212. A corresponding adjustment of one master clock period is also made to the residue value stored in R register 204. In this way, the required values are generated for local timing generator 118 (FIG. 1) to produce an edge signal at the required time.

However, as described above, in the preferred embodiment, local timing generator 118 (FIG. 1) is a conventional digital timing generator. It requires as an input a binary fraction of a period of the master clock signal. The residue value generated by global timing generator 110 represents the numerator of a fraction, which is not a binary fraction. FIG. 1 shows that the output of global timing generator 110 is passed to convert circuit 116. Convert circuit 116 converts the fraction into a binary fraction.

Figure 3:
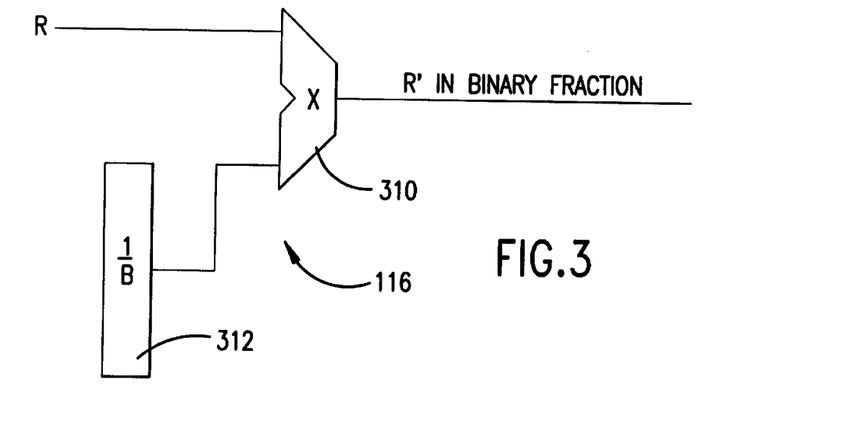
FIG. 3 is a schematic diagram of the converter circuit of FIG. 1.

FIG. 3 shows greater details of convert circuit 116. Convert circuit 116 includes a digital multiplier 310 and a register 312. The residue, R, from global timing generator 110 is provided to one input of multiplier 310. The second input of multiplier 310 is provided from register 312.

Convert circuit 116 produces an output which is the residue value divided by B. the denominator of the fraction. However, because digital dividers are relatively large and expensive to implement, a multiplier is used instead. The multiplicand is the inverse of B, which is stored in register 312. The inverse of B is computed by the computer work station (not shown) attached to tester 100. That value is then loaded at the same time as the B value in register 206 (FIG. 2). Thus, the output of convert circuit 116 is the required binary fraction for local timing generator 118.

Global analog timing generators 112 operate differently than global digital timing generators 110. No period pulse signal is required for the generation of analog signals. Also, the generated residue values do not represent time delays directly, but represent addresses into memory 124 (FIG. 1) where one period of a sine wave is stored. The values stored in memory 124 are derived according to the equation:

$$S = \text{sine}\ (2\pi * A/K) \qquad \text{Eq.2}$$

where A is the address at which the value is stored and K is the number of locations in memory 124 used to store signal information. K is could be, but is not necessarily, a power of 2. If addresses increasing by one are applied to this memory synchronized to master clock 114, the frequency of the output is $1/(T_{MC}K)$.

To generate a sine wave at a programmed frequency, global analog timing generators 112 produce a series of addresses, which increase by a programmable amount. To double the frequency, the address should increase by two each cycle. To triple the frequency, the address should increase by three each cycle, etc. Thus, the amount, I, by which the address should increase each cycle of master clock 114 is given by the ratio of the programmed frequency to $1/T_{MC}K$ according to the equation:

$$F_{prog}/(1/T_{MC}K) = I \qquad \text{Eq.3}$$

The address generated by global analog timing generator 112 should increase by an amount I for each cycle of master clock 114. However, the generated address should not increase above K. Whenever adding I to the generated address would increase it above K, the value of K should be subtracted from the result.

These operations are essentially identical to the operations used to generate the residue signal R in the global digital timing generator 110. Accordingly, the circuitry used to implement global analog timing generator resembles the circuitry used to global digital timing generator 110.

Figure 4:
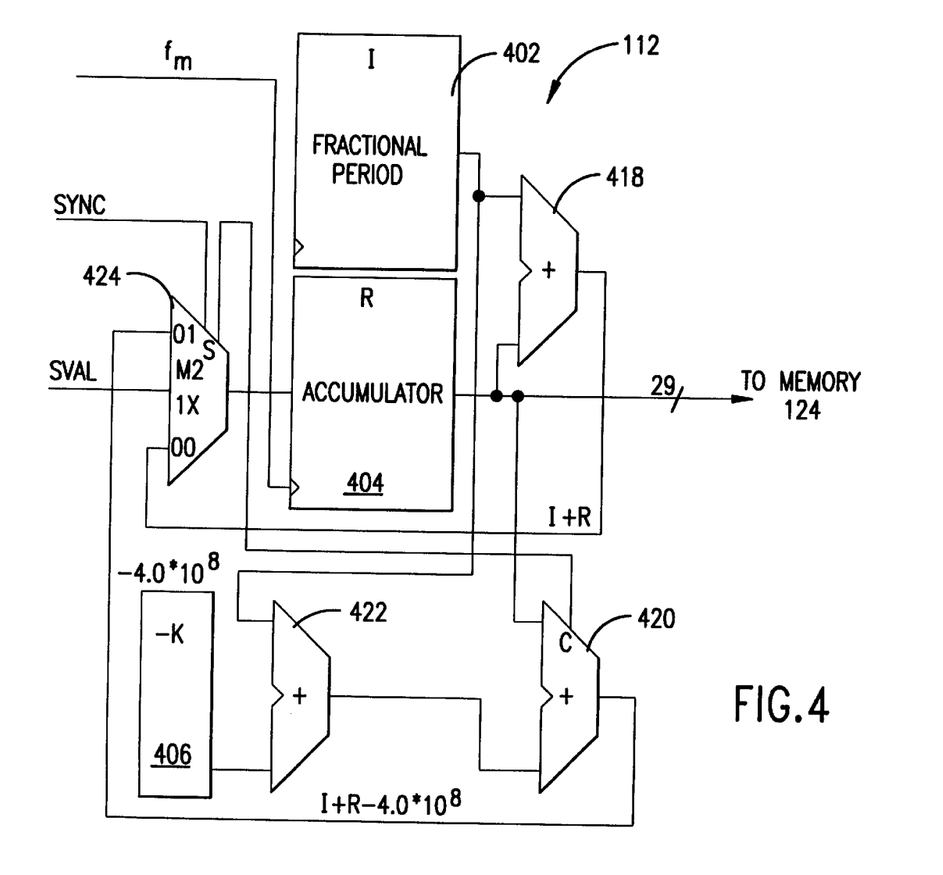
FIG. 4 is schematic diagram of the global analog timing generator of FIG. 1.

FIG. 4 shows that global analog timing generator 112 includes register 406 storing the value of −K. An adder 422 receives the output of register 406 and also the I value from register 402.

The output of adder 422 provides on input to adder 420. The second input to adder 420 comes from the R register 404.

The carryout output of adder 420 is connected to one select input of multiplexer 424. The second control input of the multiplexer is derived from the SYNC control input.

One data input to multiplexer 424 comes from adder 418, which computes the sum of the R value in register 404 and the I value in register 402. The other data input of multiplexer 424 comes from the output of adder 420.

As in global digital timing generator 110, the carry out output of adder 420 controls what is stored in R register 404. As long as the value of R is less than K, the carry out output of adder 420 controls multiplexer 424 to configure register 404 as an accumulator. When the R value would exceed K, R register 404 is loaded with the value of I+R−K. The R value is output as the address of analog signal memory 124.

Unlike in global digital timing generator 110, R register 404 loads a new value on every pulse of master clock 114. Also, the I value in register 402 is constrained to change only at the start of a pattern. Thus, the I input for adder 422 comes from the value loaded into I register 402 rather than from the value about to be loaded into it as shown in FIG. 2.

Global digital timing generators 110A and 110B may be synchronized to generate edge signals at the same time. For synchronized signals to occur, global digital timing generator 110A and 110B must be loaded with the same values of N, I and R. When the SYNC signal is asserted, new values of I and N are loaded into each. If desired the values of I and N into global digital timing generator 110A and 110B can be the same. Upon occurrence of the SYNC signal, a value is loaded into R register 204 of both global timing generator 110A and 110B from the SVAL line. FIG. 1 shows that the SVAL line of each global digital timing generator 110A and 110B is connected to the R output of global digital timing generator 110A. Thus, upon occurrence of a SYNC command, all global digital timing generators will have their values synchronized to global digital timing generator 110.

To synchronize two timing generators, it is not necessary that both timing generators be loaded with the same values of N and I. If different N or I values are used, the timing generators will generate signals of different frequencies. However, a point of synchronization is created when the two timing generators are loaded with the same R value.

Global analog timing generators 112A and 112B may also be synchronized to global digital timing generator 110A. An analog timing generator is said to be synchronized to the digital timing generator when the digital timing generator produces a timing edge at the same time as the zero crossing of the signal produced by the analog timing generator. The value which needs to be loaded into R register 404 in global analog timing generator 112 in order to synchronize the analog and digital signals is computed by adjustment circuit 126.

At the occurrence of a period pulse signal from global digital timing generator IOA, the required digital edge will occur after a delay of the fractional portion of a master clock signal 114 given by R/B. Since, in the global analog timing generator, a master clock period represents an increase of $I_{analog}$, the required delay can be expressed $(R/B)*I_{analog}$. The zero crossing of the signal occurs when R value in register 404 takes on a value of K. To synchronize the zero crossing with the programmed digital edge when the period pulse signal is generated, the R value in register 404 must be loaded with a value which will increase to K in the required delay of $(R/B)*I_{analog}$. That value is given by the formula $K-(R/B)*I_{analog}$. Adjust circuit 126 (FIG. 1) computes this value and provides it to the SVAL input of global analog timing generators 112.

Adjust circuit 126 is digital logic circuit which performs this computation. It should be noted that convert circuit 116A (FIG. 1) computes the value of (R/B). The value of R/B could be computed in the same fashion as in convert circuit 116A. Alternatively, it might be possible in some instances for the output of convert circuit 116A to be used in the computation.

Though the circuitry needed to compute the SVAL for global analog timing generators 112 is relatively straight forward, it might require more than one clock cycle to operate, especially if tester 100 is to operate at a high speed. If adjust circuitry 126 introduces too much delay, the analog timing generators 112 will not have the intended synchronization. If the delay introduced by adjust circuit 126 is a fixed delay, such as might occur in a pipelined system, then the generated analog timing signals will have their zero crossings at a time which is that fixed delay after the digital timing pulse. In this circumstance, the delay introduced by adjust circuit 126 appears as a phase error in the analog signal, which may be acceptable for many applications.

Alternatively, the outputs of global digital timing generators 110 could be delayed relative to the outputs of global analog timing generators 112 by the same amount of delay introduced by adjust circuit 126. In this case, the analog signal would be synchronized to the digital timing pulse without phase delay.

As another alternative, look ahead circuit 128 might be employed. Look ahead circuit 128 computes the value of $R_1$ some number of master clock cycles in advance. The number of clock cycles would be equal to the delay introduced by adjust circuit 126.

Figure 5:
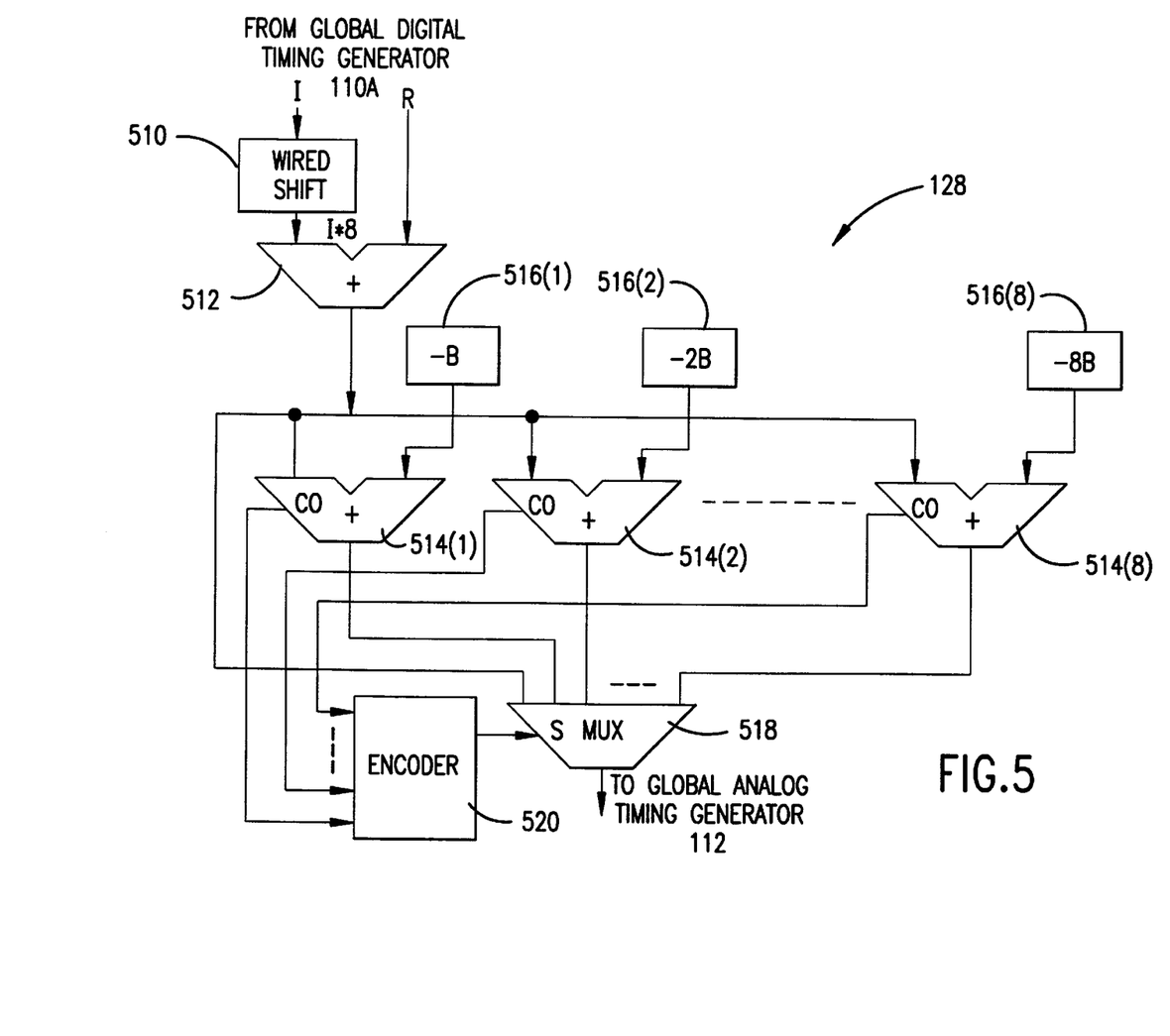
FIG. 5 is a schematic diagram of the look ahead circuit of FIG. 1.

FIG. 5 shows a schematic of a look ahead circuit which produces the value of R eight master clock pulses in advance. For its operation, it requires that the value of I in global digital timing generator 110 not change for eight master clock pulses in advance of the synchronization command. A circuit for looking ahead any number of clock pulses could be built, but preferably that number is a power of two. This requirement is implemented by appropriate programming of digital pattern generator 120.

Look ahead circuit 128 operates by multiplying the I value in global digital timing generator 110A by 8. This is the amount that will be added to the R value in eight cycles of master clock 114. Multiplication by eight is simply implemented by shifting each bits of the number three spaces. FIG. 5 shows wired shift 510. Wired shift 510 is not actually a separate component. Rather, it is achieved by routing of individual data lines to adder 512.

The value of 8*I is added to the current value of R at adder 512. This sum might exceed the value of B, but in global digital timing generator 110A, the value of R never exceeds B. Thus, the sum 8*I+R must be mapped to a number less than B using a "mod" function, i.e. the remainder of divide operation.

The mod function can be implemented in hardware by successively subtracting the value of B from the sum 8*I+R until one subtraction resulted in a negative value. The result of the prior subtraction would be the remainder. However, a simpler and faster circuit can be used because of constraints on the values of I and R. The sum 8*I+R will always be less than 9*B. Thus, a maximum of 8 subtractions will be needed.

These subtractions are performed in parallel by adders 514(1) . . . 514(8). One input of each adder 514(1) . . . 514(8) receives the sum computed by adder 512. The second input of each of the adders 514(1) . . . 514(8) is connected to the registers 516(1) . . . 516(8), respectively.

Values of −B, −2B . . . −8B are loaded into registers 516(1) . . . 516(8), respectively. Since B is, for a matter of convenience, established when a pattern is setup and does not change during the pattern, these values can be computed on the computer work station (not shown) connected to tester 100 (FIG. 1) and stored prior to execution of a pattern.

Adders 514(1) . . . 514(8), also act as comparators. The successive adders are comparing the value of I*8 to successive multiples of B, namely B, 2B, . . . 8B. The carry out bit of an adder will be set when I*8 is larger than the respective multiple of B. The first of the adders 514(1) . . . 514(8) not to have its carry out bit set indicates that the output of the prior adder is the desired result. When the carry out output of adder 516(1) is not set, it indicates that the output of adder 512 is the desired result. When all of the carry out bits of adders 514(1) . . . 514(8) are set, the output of adder 514(8) is the desired output.

The outputs of adders 514(1) . . . 514(8) as well as the output of adder 512 are provided to multiplexer 518. The carry out outputs of adders 514(1) . . . 514(8) are provided to encoder 520. Encoder 520 is a digital logic circuit which produces the control input for multiplexer 518, causing multiplexer 518 to select the appropriate value.

The selected value represents (8*I+R)mod B. This value is the value which R will have eight clock pulses in the future. It may be used to synchronize all of the global timing generators.

Use of timing generators according to the invention allows great flexibility in the generation of test signals. A very wide range of frequencies can be programmed with high resolution. Analog signals with different frequencies could be generated by programming different values into global analog timing generators 112A and 112B. Also, different frequency digital signals could be generated. Alternatively, these signals can be made coherent by choosing the N, I and B to be the same for each digital timing generator or the same values of I and K for the analog timing generator.

Even where noncoherent signals are generated, they can be synchronized at some programmable time. Thereafter, the values of the signals will drift apart because the signals have different frequencies. However, because the signals are synchronized, they will drift apart in a repeatable manner. This feature is useful to implement "pseudo asynchronous testing". When a DUT is tested with input signals of two different frequencies, the test result should be the same for every part tested.

In addition, the analog and digital timing signals can be synchronized. Even if the analog frequency is slightly different than the digital frequency, the analog and digital timing generators can be synchronized during the execution of a test pattern. The synchronization can occur at multiple times for greater accuracy. This feature is very useful for mixed signal testing.

Having described one embodiment, numerous alternative embodiments or variations might be made.

It was described as part of the synchronization operation that all global digital timing generators are loaded with the R value from global digital timing generator 110A. The R value could be derived from any of the timing generators. Alternatively, the R value could come from some external source. It is not actually required that all global digital timing generators be loaded with the same R value. For synchronization, it is only necessary that there be some deterministic relationship between the R values.

As a further alternative, it was described that during the synchronization operation that a value of R was loaded from one timing generator to others in a "master slave" arrangement. The value of N might be loaded into the "slave" timing generator as well. Rather than having each timing generator produce a pulse its programmed time after the synchronization time, the slave timing generator will produce its next timing pulse at the same time as the master.

It was described that the values loaded into analog signal memories 124A and 124B are sine waves. Any periodic signals could be generated. It was also described that memories 124A and 124B are loaded into the memory for generating analog signals. Alternatively, those memories could be used to store samples of received analog signals.

FIG. 1 shows two global digital timing generators and two global analog timing generators. Any number of either type of timing generators might be used. Also, FIG. 1 suggests that all timing generators are synchronized to one digital timing generator. Any subset of the timing generators might be synchronized to any reference point.

Also, it was described that an analog timing generator is synchronized by having the zero crossing of the generated signal be coincident with a digital timing pulse. Synchronization could be achieved by having any known point on the analog signal coincident with the pulse.

Also, it should be appreciated that the preferred embodiment was described in terms of discrete functional elements. It is anticipated that these elements will be implemented as part of an ASIC, such as a semicustom circuit or programmable gate array. Actual implementation can vary, depending on the implementation of the rest of tester 100. Also, it should be noted that the specific hardware elements used are not the only elements which could be used to provide the required functions.

For implementation convenience, the value of B was constrained not to change during the execution of a test pattern. This constraint allows various values to be precomputed and dispenses with the need for hardware to compute the required values in real time. Where greater flexibility is needed, those values could be made variable.

As another example of a variation which might be made, it was described that the timing values produced by global analog timing generators 112A and 112B are used to generate analog signals. Those values might also be used to control the timing of samples of an analog signal.

Therefore, the invention should be limited only by the spirit and scope of the appended claims.

What is claimed is:

1. A tester including timing generation circuitry, the timing generation circuitry comprising:
   a) a local timing generator having a timing signal input, a digital input and a timing signal output, said timing signal output occurring after the timing signal input by an amount of time determined by the digital input;
   b) a global timing generator producing a timing signal and a first digital signal, said first digital signal having a value less than a first value, the first value being programmable; and
   c) a conversion circuit having an input coupled to the first digital signal and an output coupled to the digital input of the local timing generator, said output having a value proportional to the first digital signal divided by the first value for providing a fractional value for the digital input of the local timing generator, thereby allowing said amount of time occurring between the timing signal output and the timing signal input of the local timing generator to be precisely determined.

2. The tester of claim 1 wherein the global timing generator comprises:
   a) a first register having an input and an output, the output being coupled to the first digital signal output of the global timing generator;
   b) a first adder having an input coupled to the output of the first register and a second input coupled to a second value and an output;

c) means for producing a control signal when the output of the first adder will exceed the first value; and d) means for selecting between at least the output of the first adder when the control signal indicates that the output of the first adder will not exceed the first value and a third value when the control signal indicates that the output of the adder will exceed the first value, said means for selecting being connected to the input of the first register.

3. The tester of claim 2 wherein:

a) the means for producing a control signal comprises an arithmetic circuit computing the sum of the value in the first register, the second value and the negative of the first value; and b) the arithmetic circuit comprises a carry out signal which is asserted when the computed sum is negative, said carry out signal being the control signal.

4. The tester of claim 3 wherein the third value selected by the means for selecting is the sum computed by the arithmetic circuit.

5. A method of operating a tester for testing a semiconductor device having:

a) a clock;

b) a plurality of programmable global timing generators including at least one global digital timing generator and at least one global analog timing generator, each producing a respective digital timing value indicating a fraction of the period of the clock;

c) a formatter providing digital test signals for the semiconductor device, the formatter in a first signal path including a global digital timing generator; and d) an analog instrument providing analog test signals for the semiconductor device, the analog instrument in a second signal path including a global analog timing generator;

the method comprising the steps of:

i) running a test program;

ii) during the execution of the test program, executing a synchronization command which causes a timing value to be loaded from the global digital timing generator to the global analog timing generator;

iii) using the digital timing value of the global digital timing generator to produce timing signals to control the timing of the digital test signals at the semiconductor device; and iv) using the digital timing value of the global analog timing generator to produce timing signals to control the timing of the analog test signals at the semiconductor device.

6. The method of claim 5 wherein:

a) each of the global timing generators includes an accumulator which is increased by a programmable amount on each cycle of the clock and stores a digital value indicative of the fraction of the period of the clock; and b) the synchronization command causes the value in the accumulator of the global digital timing generator to be loaded into the accumulator of the global analog timing generator.

7. The method of claim 5 wherein the step of using the digital timing value to produce analog signals comprises applying the digital timing value as an address to a memory storing samples of a periodic signal.

8. The method of claim 7 wherein the step of executing a synchronization command comprises:

a) obtaining a digital timing value from the global timing generator controlling the timing of digital signals at the device under test;

b) adjusting the digital timing value so that the next digital timing value produced by the global timing generator controlling the production of analog signals generates an address which corresponds to a predetermined point on the periodic signal; and c) loading the adjusted value into the global analog timing generator.

9. The method of claim 8 wherein the predetermined point on the periodic signal is a zero crossing of the signal.

10. The method of claim 8 wherein the step of adjusting the digital timing value comprises:

a) multiplying the digital timing value from the global timing generator controlling the timing of digital signals by a value representing the number of addresses which the digital timing value used to produce analog signals increases each clock period; and b) subtracting the result of the multiplication from the total number of addresses in the memory used to store samples of the periodic signal.

11. The method of claim 8 wherein the step of executing a synchronization command comprises:

a) obtaining a digital timing value from the global digital timing generator at a first clock cycle;

b) computing from the obtained value the value of the digital timing value will have after a set number of clock periods; and c) using the projected value for computation of the adjusted value.

12. A method of operating a tester in which test signals are controlled by timing signals comprising:

a) providing a clock signal;

b) counting a predetermined number of clock periods and generating an intermediate timing signal which is coupled to an output timing signal;

c) for each clock period, increasing the value in an accumulator by an amount representing the numerator of a non-binary fraction;

d) determining whether increasing the value in the accumulator causes it to increase above a value representing the denominator of the non-binary fraction;

e) when increasing the value in the accumulator causes the value in the accumulator to increase above the denominator, reducing the accumulated value by the value of the denominator and delaying the next generated intermediate timing signal by one period of the clock signal before it is coupled to the output timing signal; and f) utilizing the intermediate timing signal, after processing in accordance with step e) to control one of said test signals.

13. The method of claim 12 additionally comprising:

a) routing the output timing signal and the value in the accumulator upon the occurrence of the output signal to a plurality of circuits throughout the tester; and b) controlling the timing of test events in the plurality of circuits to occur at the time specified by the occurrence of the output timing signal plus a delay equal to the fraction represented by the value in the accumulator divided by the value representing the denominator.

14. The method of claim 13 wherein the step of routing comprises first dividing the value in the accumulator by the value of the denominator to produce a binary fraction.

15. The method of claim 14 wherein the step of dividing comprises:

a) computing in advance the reciprocal of the value representing the denominator; and b) multiplying the value in the accumulator by the computed reciprocal.

16. The method of claim 12 additionally comprising the step of, during the execution of a test program, loading a value into a counter indicating the predetermined number of clock periods and loading into a register a value representing the numerator of the non-binary fraction.

17. The method of claim 12 additionally comprising the step of generating a series of address to a memory storing a plurality of samples of a periodic signal.

18. The method of claim 17 wherein the step of generating a series of addresses comprises:
   a) for each clock period, increasing the value in a second accumulator by an amount representing the numerator of a binary fraction;
   b) determining whether increasing the value in the accumulator causes it to increase above a value representing the denominator of a non-binary fraction; and
   c) when increasing the value in the second accumulator causes it to increase above the denominator, reducing the value in the accumulator by the value of the denominator.

19. The method of claim 18 additionally comprising the steps of:
   a) generating a synchronization command; and
   b) in response to the synchronization command, loading a value in the second accumulator, the value in the second accumulator derived from the value in the first accumulator.

20. The method of manufacturing a semiconductor device using the method of claim 13, the method of manufacture comprising the steps of:
   a) fabricating a semiconductor device;
   b) connecting the semiconductor tester; and
   c) running a test pattern on the semiconductor device, with events timed in accordance with the method of claim 14.

* * * * *